(12) United States Patent
Lee

(10) Patent No.: US 6,235,623 B1
(45) Date of Patent: May 22, 2001

(54) METHODS OF FORMING INTEGRATED CIRCUIT CONTACT HOLES USING BLOCKING LAYER PATTERNS

(75) Inventor: Kyu-Hyun Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/184,227

(22) Filed: Nov. 2, 1998

(30) Foreign Application Priority Data

Nov. 4, 1997 (KR) .................................................. 97-57914

(51) Int. Cl.⁷ ................................................ H01L 21/4763
(52) U.S. Cl. ............................ 438/618; 438/612; 438/613
(58) Field of Search ................................... 438/618, 612, 438/613

(56) References Cited

U.S. PATENT DOCUMENTS 5,387,533 * 2/1995 Kim .
6,004,839 * 12/1999 Hayashi et al. .

* cited by examiner

*Primary Examiner*—Kevin M. Picardat
*Assistant Examiner*—D. M. Collins

(74) *Attorney, Agent, or Firm*—Myers Bigel Sibley & Sajovec

(57) ABSTRACT

Integrated circuit contact holes may be formed on an integrated circuit substrate, by providing a first conductive pattern on the substrate, a first interlayer insulating film on the first conductive pattern, a second conductive pattern on the first interlayer insulating film and a second interlayer insulating film on the second conductive pattern. A blocking layer pattern is formed on the second interlayer insulating film. The blocking layer pattern overlies, is of the same pattern as, and is as least as wide as the second conductive pattern. The first and second interlayer insulating films are then selectively etched relative to the blocking layer pattern and the second conductive pattern, to form contact holes that expose the first conductive pattern. A photoresist pattern may also be formed on a portion of the blocking layer pattern. Then, the first and second interlayer insulating films are selectively etched relative to the photoresist pattern, the blocking layer pattern and the second conductive pattern, to form contact holes that expose the first conductive pattern. The above-described integrated circuit contact hole forming methods may also be used to form integrated circuit contact holes for integrated circuit memory devices. For integrated circuit memory devices, the first conductive pattern may correspond to pad electrodes, the second conductive pattern may correspond to bit lines, and capacitor contact plugs may be formed in the contact holes.

24 Claims, 5 Drawing Sheets

METHODS OF FORMING INTEGRATED CIRCUIT CONTACT HOLES USING BLOCKING LAYER PATTERNS

FIELD OF THE INVENTION

This invention relates to integrated circuit fabrication methods, and more particularly to methods of forming integrated circuit contact holes.

BACKGROUND OF THE INVENTION

As the integration density of integrated circuit devices continues to increase, it may become more difficult to form contact holes for these highly integrated devices. As is well known to those having skill in the art, contact holes are used to connect conductive layers of an integrated circuit to one another, through intervening dielectric layers.

For example, as the integration density of integrated circuits continues to increase, and device patterns become smaller, exposure technology has moved to shorter wavelengths, from g-line (436 nm) to i-line (365 nm) to KrF excimer laser (248 nm) and ArF excimer laser (193 nm). However, even with the increasingly short wavelengths, it may be increasingly difficult to form patterns of 0.1 $\mu$m or less.

Multilevel resist processes have also been used to form contact holes for highly integrated devices. Unfortunately, multilevel resist processes can still produce undesired short circuits between adjacent contacts.

FIGS. 1 and 2 are cross-sectional views illustrating a conventional contact-forming process for an integrated circuit Dynamic Random Access Memory (DRAM) device. As shown in FIG. 1, device isolation regions 12 are formed in an integrated circuit substrate, such as a semiconductor substrate 10, to define active and inactive regions. A plurality of pad electrodes, such as polysilicon pad electrodes 14, also referred to as poly pads, are formed on the active region of the semiconductor substrate 10. A first interlayer insulating film 16 is formed on the substrate 10, including on the poly pads 14. Bit line electrodes 18 are formed on the first interlayer insulating film 16 over the inactive regions, between the poly pads 14. The bit line electrodes 18 include a capping layer 20 thereon and a sidewall spacer 21 on the sidewalls thereof. The capping layer 20 and the sidewall spacers 21 may comprise silicon nitride.

A second interlayer insulating film 22 is formed on the first interlayer insulating film 16 including on the bit line electrodes 18. A photoresist layer pattern 24 is formed on the second interlayer insulating film 22. Unfortunately, the "proximity effect" may cause the photoresist layer pattern 24 to be uneven, due to the small spacing the pattern. In particular, as shown in FIG. 1, the proximity effect may cause an undesired pattern shape 24' in the photoresist layer pattern 24. As is well known to those having skill in the art. The proximity effect occurs when light that is projected through a closely spaced mask pattern overlap and form an unclearly patterned area therebetween.

As shown in FIG. 2, contact holes 25 are formed to expose the poly pads 14 by etching the first and second interlayer insulating films 16 and 22 respectively, using the photoresist layer pattern 24 as a mask. Conductive material such as polysilicon is then deposited in the contact holes 25, to thereby form a storage polysilicon layer 26.

Unfortunately, as shown in FIG. 2, since the photoresist layer pattern 24 is improperly formed over some of the bit line electrodes due to the proximity effect, the photoresist layer pattern 24 exposes portions of the second interlayer insulating film 22 on some of the bit line electrodes. The second interlayer insulating film 22 is thereby etched between the contact holes during the formation of the contact holes 25. This can result in bridging between the storage polysilicon layers as shown by the dotted circle 28. This bridging can reduce the reliability and/or yield of the integrated circuits. Moreover, bridging may increase as the integration density of the integrated circuits increases.

SUMMARY OF THE INVENTION

It is therefore an object of the present invention to provide improved methods of forming contact holes for integrated circuit devices including integrated circuit memory devices.

It is another object of the present invention to provide methods of forming contact holes that can reduce and preferably eliminate bridging between contact holes.

These and other objects are provided, according to the present invention, by forming a blocking layer pattern on a second interlayer insulating film and then selectively etching first and second interlayer insulating films relative to the blocking layer pattern, to form a plurality of contact holes. The blocking layer pattern can thus provide an etch barrier layer for contact hole formation that can overcome proximity effect limitations, which can thereby prevent bridging between the contact holes.

More specifically, integrated circuit contact holes may be formed on an integrated circuit substrate, by providing a first conductive pattern on the substrate, a first interlayer insulating film on the first conductive pattern, a second conductive pattern on the first interlayer insulating film and a second interlayer insulating film on the second conductive pattern. A blocking layer pattern is formed on the second interlayer insulating film. The blocking layer pattern overlies, is of the same pattern as, and is as least as wide as the second conductive pattern. The first and second interlayer insulating films are then selectively etched relative to the blocking layer pattern and the second conductive pattern, to form a plurality of contact holes that expose the first conductive pattern.

The blocking layer pattern preferably comprises polysilicon and/or silicon nitride. The second conductive pattern preferably comprises a conductive core pattern and a coating on the conductive core pattern. Then, the first and second interlayer insulating films are selectively etched relative to the blocking layer pattern and the coating, to form the plurality of contact holes that expose the first conductive pattern.

A photoresist pattern may also be formed on a portion of the blocking layer pattern. Then, the first and second interlayer insulating films are selectively etched relative to the photoresist pattern, the blocking layer pattern and the second conductive pattern, to form a plurality of contact holes that expose the first conductive pattern.

The photoresist pattern may include a plurality of elongated openings therein. In one embodiment, a respective opening exposes a portion of the blocking layer pattern and extends beyond the exposed portion of the blocking layer pattern. In another embodiment, a respective opening exposes and extends between at least two portions of the blocking layer pattern.

The above-described integrated circuit contact hole forming methods may also be used to form integrated circuit contact holes for integrated circuit memory devices. For integrated circuit memory devices, the first conductive pattern may correspond to a plurality of pad electrodes, the second conductive pattern may correspond to a plurality of bit lines, and capacitor contact plugs may be formed in the plurality of contact holes.

According to another aspect of the present invention, a blocking layer pattern is formed on the second interlayer insulating film that overlies the second conductive pattern. A photoresist is formed on a portion of the blocking layer pattern. The first and second interlayer insulating films are selectively etched relative to the photoresist pattern, the blocking layer pattern and the second conductive pattern to form a plurality of contact holes that expose the first conductive pattern. The composition of the blocking layer pattern and the second conductive pattern, and the openings in the photoresist pattern, may be as described above. This aspect of the present invention may also be used to form integrated circuit memory device contact holes as described above.

Accordingly, the blocking layer pattern can serve as an etch barrier layer for contact hole formation, thereby reducing and preferably preventing bridging between contact holes due to the proximity effect. Moreover, the photoresist pattern may include elongated openings, since the blocking layer pattern underlies the photoresist layer. Highly integrated contact holes may thereby be formed in a self-aligned manner, to reduce and preferably eliminate bridging between contact holes.

DETAILED DESCRIPTION OF PREFERRED EMBODIMENTS

Figure 1:
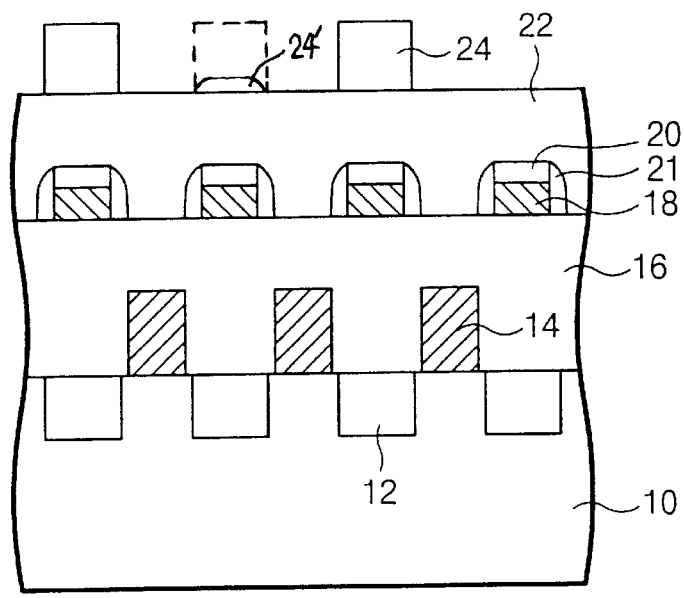
FIGS. 1 and 2 are cross-sectional views illustrating steps of a conventional method of forming integrated circuit contact holes.
Figure 2:
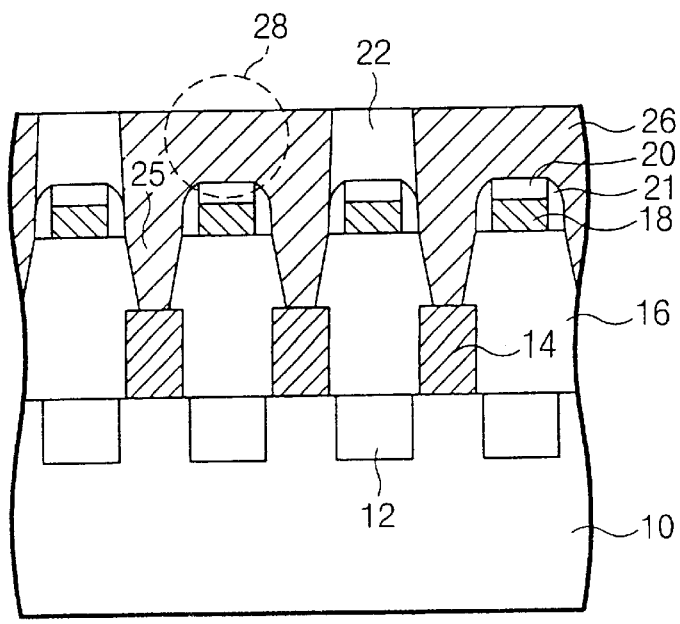

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may be present. In contrast, when an element is referred to as being "directly on" another element, there are no intervening elements present. Moreover, each embodiment described and illustrated herein includes its complementary conductivity type embodiment as well.

Figure 3:
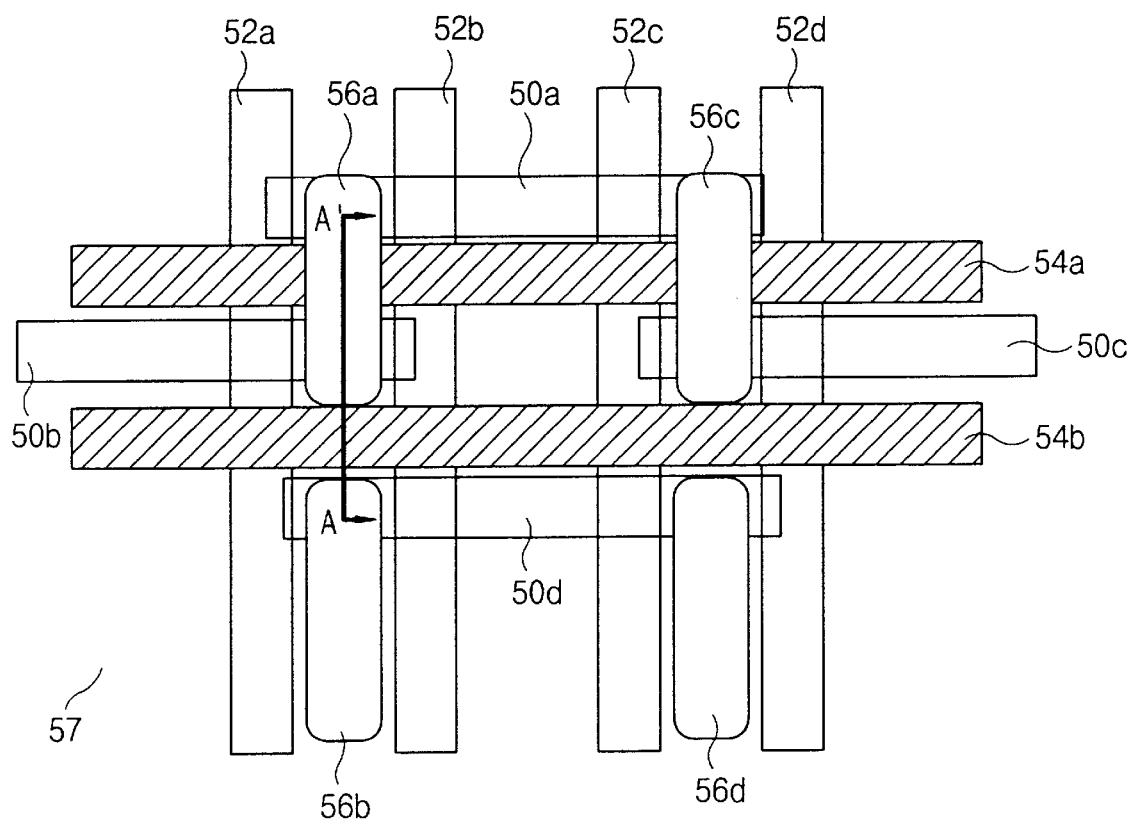
FIG. 3 is a top view of an integrated circuit substrate illustrating mask patterns that may be used to form integrated circuit contact holes according to the present invention.

Referring to FIG. 3, mask patterns that may be used to form integrated circuit contact holes according to the present invention will now be described. As shown in FIG. 3, reference numbers 50a–50d represent active masks that define active and inactive regions, and reference numbers 52a–52d represent gate electrode masks. Reference numbers 54a–54b represent blocking pattern masks. Reference numbers 56a–56d represent etch masks for buried contact formation and correspond to openings in a photoresist layer pattern. Finally, reference number 57 represents portions of the substrate that are covered by the photoresist layer pattern.

As shown in FIG. 3, the photoresist pattern includes a plurality of elongated openings 56a–56d, also referred to as bar-type openings. Each of the openings 56a–56d simultaneously exposes two active cells by exposing a portion of the blocking layer pattern 54a–54b, and extending beyond the exposed portion of the blocking layer pattern. Stated differently, the bar-type openings expose two active regions on opposite sides of an exposed blocking layer pattern. Thus, for example, the bar-type opening 56a exposes active regions 50a–50b and the blocking layer pattern 54a therebetween.

Alternatively, the openings in of the photoresist pattern may be extended line-type openings, by combining adjacent bar-type openings. For example, the openings 56a and 56b can be extended into a single line-type opening and the openings 56c and 56d can be extended into a single line-type opening. A line-type opening exposes and extends between at least two portions of the blocking layer pattern. The bar-type opening, and line-type openings can have a reduced proximity effect compared to closely spaced contact holes, to thereby reduce bridging between contact holes.

Electrode masks may also be included for bit lines. These masks are not shown in FIG. 3, because they lie beneath the blocking layer pattern masks 54a and 54b.

FIGS. 4–9 are cross-sectional views illustrating methods of forming integrated circuit contact holes according to the present invention. FIGS. 4–9 will be described relative to a DRAM device. However, it will be understood that the present invention may be used to form integrated circuit contact holes for other integrated circuit devices.

Figure 4:
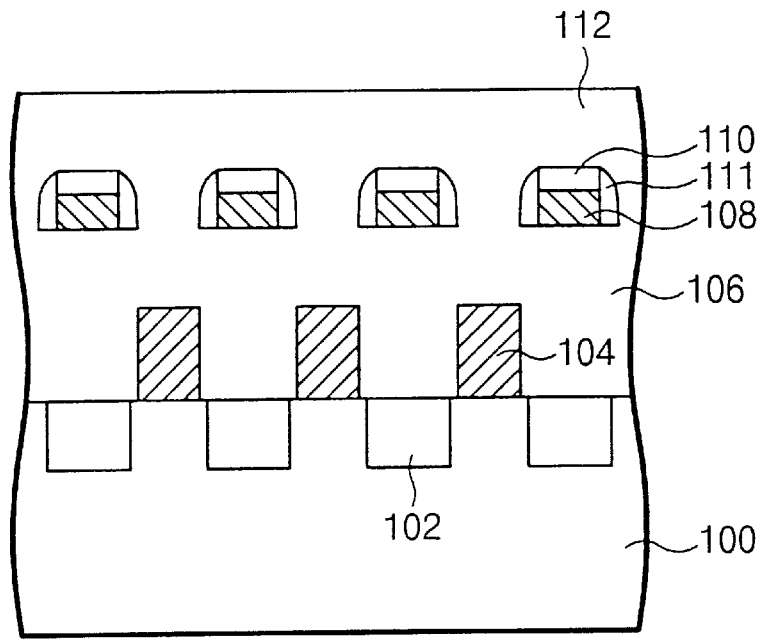
FIGS. 4–9 are cross-sectional views illustration steps of methods of forming integrated circuit contact holes according to the present invention.

Referring now to FIG. 4, device isolation regions 102 are formed in an integrated circuit substrate such as a semiconductor substrate 100 using active masks 50a–50d of FIG. 3. The device isolation regions 102 may be formed by shallow trench isolation or other conventional techniques. A plurality of pad electrodes, also referred to as poly pads 104, that are used for DRAM cell capacitor contacts, are formed on the active region of the substrate 100.

A first interlayer insulating film 106 is formed on the integrated circuit substrate 100 including on the poly pads 104. The first interlayer insulating film 106 is preferably planar or planarized.

A plurality of bit line electrodes 108 are formed on the first interlayer insulating film 106 using a bit line electrode mask. A coating is formed on the bit line electrodes 108. The coating preferably comprises a capping layer 110 on the bit line electrodes and sidewall spacers 111 on the sidewalls of the bit line electrodes 108, so that the bit line electrodes form conductive cores.

A second interlayer insulating film 112 is formed on the first interlayer insulating film 106 and on the bit line electrodes 108. The second interlayer insulating film is preferably planar or planarized. The capping layer 100 and sidewall spacers 111 if used, comprise materials such as silicon nitride that have a high etching selectivity relative to the first interlayer insulating film 106 and the second interlayer insulating film 112.

Figure 5:
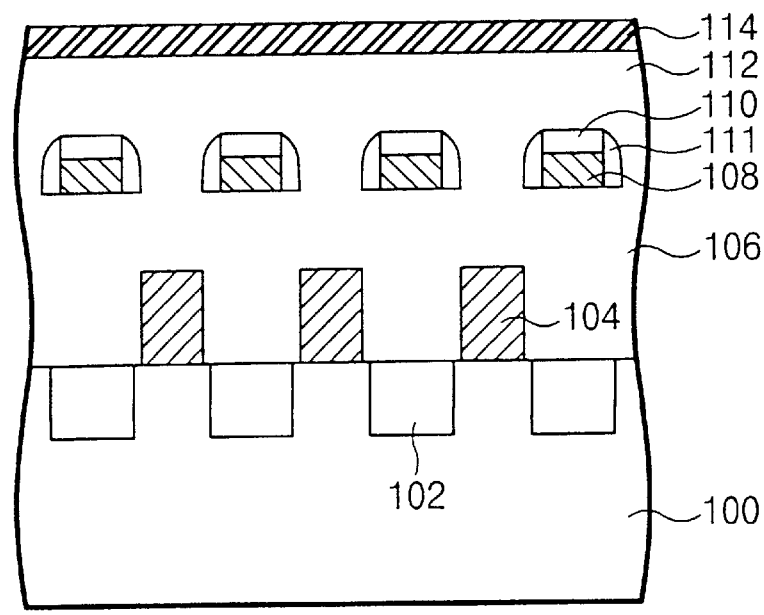

Referring now to FIG. 5, a blocking layer 114 is formed on the second interlayer insulating film 112. The blocking layer 114 comprises a material, such as polysilicon and/or silicon nitride, that has a high etching selectivity relative to the first and second interlayer insulating films 106 and 112 respectively.

Figure 6:
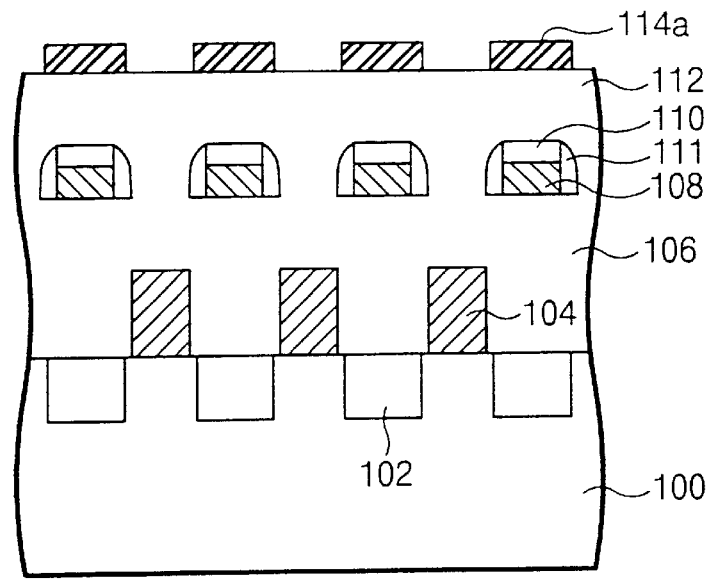

Referring now to FIG. 6, the blocking layer 114 is patterned to form a blocking layer pattern 114a, using blocking pattern masks 54a and 54b of FIG. 3. As shown in FIG. 6, the blocking layer pattern 114a overlies, is of the same pattern as, and is at least as wide as the bit lines 108. As will be described, the blocking layer pattern 114a serves as an etch barrier when forming contact holes.

Figure 7:
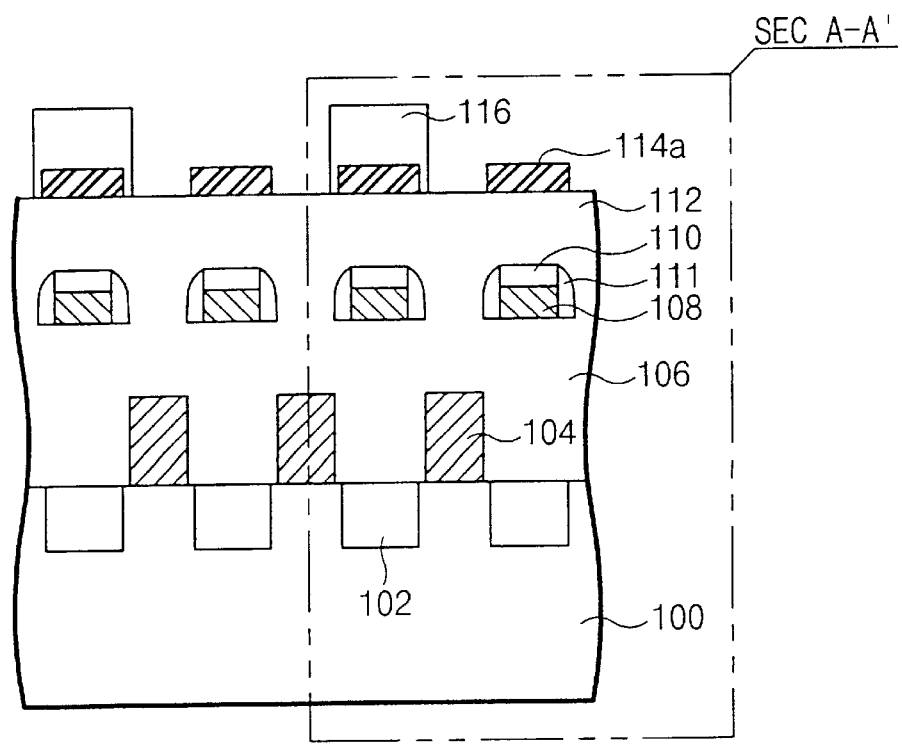

Referring now to FIG. 7, a photoresist layer pattern 116 is formed on a portion of the blocking layer pattern 114a, using the buried contact etch masks 56a–56d. The photoresist layer pattern 116 exposes the second interlayer insulating film 112 between the blocking layer patterns 114a. As was described in connection with FIG. 3, the openings in the photoresist layer pattern may be bar-type openings that simultaneously expose two active cells or may be line-type openings that combine adjacent bar-type openings. Thus, the elongated openings of the photoresist layer pattern 116 expose at least one of the blocking layer patterns 114a.

Since the blocking layer pattern 114a underlies the photoresist pattern 116, the photoresist pattern 116 can include elongated bar-type openings or line-type openings. Accordingly, process limitations when forming the photoresist layer pattern 116 can be reduced, and bridging between the contact holes can also be reduced and preferably prevented. The dotted box SEC A–A' of FIG. 7 is a cross-sectional view taken along line A–A' shown in FIG. 3.

Figure 8:
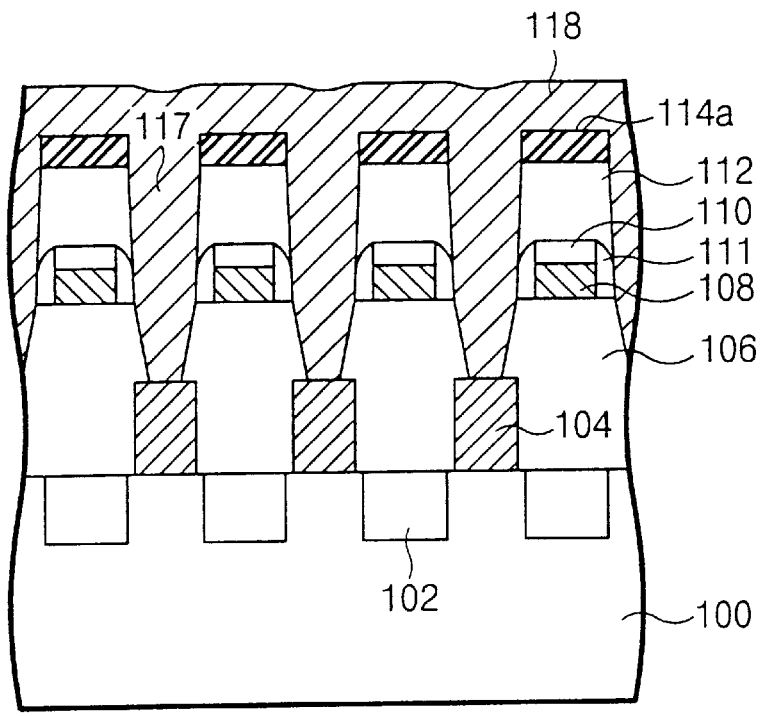

Referring now to FIG. 8, the first and second interlayer insulating films are selectively etched relative to the blocking layer pattern 114a and the bit lines 108, to thereby expose the poly pads 104. During this etch, the blocking layer pattern 114a and the photoresist pattern 116 are used as masks, to thereby form contact holes 117.

If the photoresist layer pattern 116 includes a line-type opening, the blocking layer pattern 114a can serve as an etch barrier to protect the bit line electrode 108. Alternatively, if the photoresist layer pattern has a bar-type opening, both the blocking layer pattern 114a and the photoresist layer pattern 116 can serve as an etch barrier layer.

Moreover, if the blocking layer pattern is misaligned relative to the bit lines 108, the capping layer 110 and sidewall 111 can prevent anisotropic etching, so that the contact holes 117 may be formed in a self-aligned manner. This is because the silicon nitride layer of the capping layer 110 and sidewall spacer 111 can have a high etching selectivity with respect to the first and second interlayer insulating films 106 and 112.

Still referring to FIG. 8, the photoresist layer pattern 116 is removed. The contact holes 117 are filled with a conductive material such as a storage polysilicon layer 118.

Figure 9:
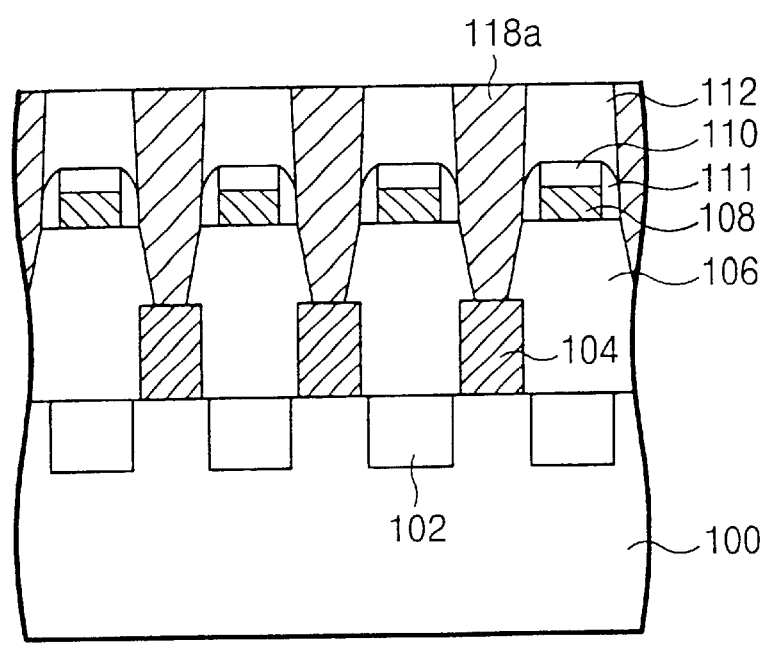

Referring now to FIG. 9, the storage polysilicon layer 118 and the blocking layer pattern 114a are etched, to thereby expose the second interlayer insulating film 112. A plurality of contact plugs 118a thus are formed, which can be electrically connected to the bottom electrode of a DRAM capacitor in subsequent fabrication steps.

Accordingly, the blocking layer pattern 114a that serves as an etch barrier layer is formed before the photoresist layer pattern 116 that is used to form the contact holes 117. The photoresist layer pattern 116 can have bar-type openings or line-type openings, so that small dimensioned openings need not be formed. Short circuits between buried contacts can be reduced and preferably prevented.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming integrated circuit contact holes, comprising the steps of:

forming on an integrated circuit substrate, a first conductive pattern, a first interlayer insulating film on the first conductive pattern, a second conductive pattern on the first interlayer insulating film opposite the first conductive pattern and a second interlayer insulating film on the second conductive pattern opposite the first interlayer insulating film;

forming a blocking layer pattern on the second interlayer insulating film opposite the second conductive pattern that overlies, is of same pattern as and is at least as wide as, the second conductive pattern; and selectively etching the first and second interlayer insulating films relative to the blocking layer pattern and the second conductive pattern to form a plurality of contact holes that expose the first conductive pattern.

2. A method according to claim 1 wherein the blocking layer pattern comprises at least one of a polysilicon blocking layer pattern and a silicon nitride blocking layer pattern.

3. A method according to claim 1 wherein the second conductive pattern comprises a conductive core pattern and a coating on the conductive core pattern, and wherein the etching step comprises the step of selectively etching the first and second interlayer insulating films relative to the blocking layer pattern and the coating to form a plurality of contact holes that expose the first conductive pattern.

4. A method according to claim 1 wherein the following step is performed between the step of forming a blocking layer pattern and the step of etching:

forming a photoresist pattern on a portion of the blocking layer pattern; and wherein the step of selectively etching comprises the step of selectively etching the first and second interlayer insulating films relative to the photoresist pattern, the blocking layer pattern and the second conductive pattern to form a plurality of contact holes that expose the first conductive pattern.

5. A method according to claim 4 wherein the photoresist pattern includes a plurality of elongated openings therein, a respective one of which exposes a portion of the blocking layer pattern and extends beyond the exposed portion of the blocking layer pattern.

6. A method according to claim 4 wherein the photoresist pattern includes a plurality of elongated openings therein, a respective one of which exposes and extends between at least two portions of the blocking layer pattern.

7. A method of forming integrated circuit memory device contact holes, comprising the steps of:

forming on an integrated circuit memory device substrate, a plurality of pad electrodes, a first interlayer insulating film on the plurality of pad electrodes, a plurality of bit lines on the first interlayer insulating film opposite the plurality of pad electrodes and a second interlayer insulating film on the plurality of bit lines opposite the first interlayer insulating film;

forming a blocking layer pattern on the second interlayer insulating film opposite the plurality of bit lines that overlies, is of same pattern as and is at least as wide as, the plurality of bit lines; and selectively etching the first and second interlayer insulating films relative to the blocking layer pattern and the plurality of bit lines to form a plurality of contact holes that expose the plurality of pad electrodes.

8. A method according to claim 7 wherein the blocking layer pattern comprises at least one of a polysilicon blocking layer pattern and a silicon nitride blocking layer pattern.

9. A method according to claim 7 wherein the plurality of bit lines comprise a plurality of bit line conductors and a coating on the plurality of bit line conductors, and wherein the etching step comprises the step of selectively etching the first and second interlayer insulating films relative to the blocking layer pattern and the coating to form a plurality of contact holes that expose the first conductive pattern.

10. A method according to claim 7 wherein the following step is performed between the step of forming a blocking layer pattern and the step of etching:

forming a photoresist pattern on a portion of the blocking layer pattern; and wherein the step of selectively etching comprises the step of selectively etching the first and second interlayer insulating films relative to the photoresist pattern, the blocking layer pattern and the plurality of bit lines to form a plurality of contact holes that expose the plurality of pad electrodes.

11. A method according to claim 10 wherein the photoresist pattern includes a plurality of elongated openings therein, a respective one of which exposes a portion of the blocking layer pattern and extends beyond the exposed portion of the blocking layer pattern.

12. A method according to claim 10 wherein the photoresist pattern includes a plurality of elongated openings therein, a respective one of which exposes and extends between at least two portions of the blocking layer pattern.

13. A method according to claim 7 wherein the selectively etching step is followed by the step of:

forming capacitor contact plugs in the plurality of contact holes.

14. A method of forming integrated circuit contact holes, comprising the steps of:

forming on an integrated circuit substrate, a first conductive pattern, a first interlayer insulating film on the first conductive pattern, a second conductive pattern on the first interlayer insulating film opposite the first conductive pattern and a second interlayer insulating film on the second conductive pattern opposite the first interlayer insulating film;

forming a blocking layer pattern on the second interlayer insulating film opposite the second conductive pattern that overlies the second conductive pattern;

forming a photoresist pattern on a portion of the blocking layer pattern; and selectively etching the first and second interlayer insulating films relative to the photoresist pattern, the blocking layer pattern and the second conductive pattern to form a plurality of contact holes that expose the first conductive pattern.

15. A method according to claim 14 wherein the blocking layer pattern comprises at least one of a polysilicon blocking layer pattern and a silicon nitride blocking layer pattern.

16. A method according to claim 14 wherein the second conductive pattern comprises a conductive core pattern and a coating on the conductive core pattern, and wherein the etching step comprises the step of selectively etching the first and second interlayer insulating films relative to the blocking layer pattern and the coating to form a plurality of contact holes that expose the first conductive pattern.

17. A method according to claim 14 wherein the photoresist pattern includes a plurality of elongated openings therein, a respective one of which exposes a portion of the blocking layer pattern and extends orthogonally beyond the exposed portion of the blocking layer pattern.

18. A method according to claim 14 wherein the photoresist pattern includes a plurality of elongated openings therein, a respective one of which exposes and extends between at least two portions of the blocking layer pattern.

19. A method of forming integrated circuit memory device contact holes, comprising the steps of:

forming on an integrated circuit memory device substrate, plurality of pad electrodes, a first interlayer insulating film on the plurality of pad electrodes, a plurality of bit lines on the first interlayer insulating film opposite the plurality of pad electrodes and a second interlayer insulating film on the plurality of bit lines opposite the first interlayer insulating film;

forming a blocking layer pattern on the second interlayer insulating film opposite the plurality of bit lines that overlies the plurality of bit lines;

forming a photoresist pattern on a portion of the blocking layer pattern; and selectively etching the first and second interlayer insulating films relative to the photoresist pattern, the blocking layer pattern and the plurality of bit lines to form a plurality of contact holes that expose the plurality of pad electrodes.

20. A method according to claim 19 wherein the blocking layer pattern comprises at least one of a polysilicon blocking layer pattern and a silicon nitride blocking layer pattern.

21. A method according to claim 19 wherein the plurality of bit lines comprise a plurality of bit line conductors and a coating on the plurality of bit line conductors, and wherein the etching step comprises the step of selectively etching the first and second interlayer insulating films relative to the blocking layer pattern and the coating to form a plurality of contact holes that expose the first conductive pattern.

22. A method according to claim 19 wherein the photoresist pattern includes a plurality of elongated openings therein, a respective one of which exposes a portion of the blocking layer pattern and extends orthogonally beyond the exposed portion of the blocking layer pattern.

23. A method according to claim 19 wherein the photoresist pattern includes a plurality of elongated openings therein, a respective one of which exposes and extends between at least two portions of the blocking layer pattern.

24. A method according to claim 19 wherein the selectively etching step is followed by the step of:

forming capacitor contact plugs in the plurality of contact holes.

* * * * *